United States Patent
Altolaguirre et al.

(10) Patent No.: US 11,901,892 B2
(45) Date of Patent: Feb. 13, 2024

(54) LEVEL SHIFTER AND CHIP WITH OVERDRIVE CAPABILITY

(71) Applicant: MEDIATEK INC., Hsinchu (TW)

(72) Inventors: Federico Agustin Altolaguirre, Hsinchu (TW); Hsin-Cheng Hsu, Hsinchu (TW)

(73) Assignee: MEDIATEK INC., Hsinchu (TW)

(*) Notice: Subject to any disclaimer, the term of this patent is extended or adjusted under 35 U.S.C. 154(b) by 0 days.

(21) Appl. No.: 17/819,994

(22) Filed: Aug. 16, 2022

(65) Prior Publication Data

US 2023/0080713 A1 Mar. 16, 2023

Related U.S. Application Data

(60) Provisional application No. 63/243,233, filed on Sep. 13, 2021.

(51) Int. Cl.
*H03K 19/0185* (2006.01)
*H03K 3/356* (2006.01)

(52) U.S. Cl.
CPC ........... *H03K 19/018521* (2013.01); *H03K 3/356104* (2013.01)

(58) Field of Classification Search
CPC ..... H03K 19/018521; H03K 19/00315; H03K 19/1737; H03K 3/356086; H03K 3/356104; H03K 19/018528; H03K 5/003; H03K 19/0175; H03K 19/017509; H03K 19/0185; H03K 19/018507
See application file for complete search history.

(56) References Cited

U.S. PATENT DOCUMENTS

| | | | |
|---|---|---|---|
| 6,566,930 B1 | 5/2003 | Sato | |
| 7,994,821 B1 | 8/2011 | Wang et al. | |
| 8,860,709 B2 | 10/2014 | Sugiyama et al. | |
| 9,628,079 B2 | 4/2017 | Pi et al. | |
| 2012/0268188 A1 | 10/2012 | Po et al. | |
| 2013/0222038 A1* | 8/2013 | Kuge | H03K 19/018521 327/333 |
| 2016/0211847 A1 | 7/2016 | Duby et al. | |

FOREIGN PATENT DOCUMENTS

| | | |
|---|---|---|
| CN | 102571065 B | 11/2015 |
| TW | 201308896 A | 2/2013 |

OTHER PUBLICATIONS

Extended European Search Report dated Feb. 14, 2023, issued in application No. EP 22195159.3.
Chinese language office action dated Jun. 8, 2023, issued in application No. TW 111134281.

* cited by examiner

*Primary Examiner* — Jung Kim
(74) *Attorney, Agent, or Firm* — McClure, Qualey & Rodack, LLP

(57) ABSTRACT

A level shifter and a chip with the level shifter are shown. Between the input pair and the cross-coupled output pair, there are a first protection circuit and a second protection circuit. An overdrive voltage, which is double the nominal voltage of the level shifter plus a delta voltage, is applied to the level shifter. The first protection circuit has a first voltage-drop circuit that compensates for the delta voltage. The second protection circuit has a second voltage-drop circuit that compensates for the delta voltage.

15 Claims, 4 Drawing Sheets

LEVEL SHIFTER AND CHIP WITH OVERDRIVE CAPABILITY

CROSS REFERENCE TO RELATED APPLICATIONS

This application claims the benefit of U.S. Provisional Application No. 63/243,233, filed Sep. 13, 2021, the entirety of which is incorporated by reference herein.

BACKGROUND OF THE INVENTION

Field of the Invention

The present invention relates to a level shifter and a chip with an overdrive capability.

Description of the Related Art

As the technology used in the semiconductor manufacturing process develops (e.g., scaling down to 5 nm, 4 nm, 3 nm, or below), it has become possible for the maximum applied voltage to be suppressed (e.g., much lower than the maximum applied voltage of 7 nm products). If there are several generations of chips on the same printed circuit board (PCB), an overdrive design is required. For example, the power system does not only provide 1.5V for new generation chips but also provides 3.3V for old generation chips, meaning that there is a need for level shifters.

BRIEF SUMMARY OF THE INVENTION

An exemplary embodiment of the present invention provides a level shifter with high reliability, and a chip using the level shifter.

A level shifter in accordance with an exemplary embodiment of the present invention comprises an input pair, a cross-coupled output pair, a first protection circuit, and a second protection circuit. The input pair has a first input transistor and a second input transistor which are controlled by an input signal and an inverse input signal of the level shifter, respectively. The cross-coupled output pair has a first output transistor and a second output transistor. The second output transistor pulls up an output terminal of the level shifter to an overdrive voltage in response to the high-level state of the input signal. The first output transistor pulls up the inverting output terminal of the level shifter to the overdrive voltage in response to the low-level state of the input signal. The first protection circuit is coupled between the inverting output terminal and the first input transistor. The second protection circuit is coupled between the output terminal and the second input transistor. The overdrive voltage is double the nominal voltage of the level shifter plus a delta voltage. The first protection circuit has a first voltage-drop circuit that compensates for the delta voltage. The second protection circuit has a second voltage-drop circuit that compensates for the delta voltage.

In an exemplary embodiment, the first protection circuit further comprises a first series of transistors, and the second protection circuit further comprises a second series of transistors. The inverting output terminal is coupled to the first input transistor through the first voltage-drop circuit and the first series of transistors. The output terminal is coupled to the second input transistor through the second voltage-drop circuit and the second series of transistors.

In an exemplary embodiment, the first protection circuit further comprises a third series of transistors coupled between the inverting output terminal and the first voltage-drop circuit, and the second protection circuit further comprises a fourth series of transistors coupled between the output terminal and the second voltage-drop circuit.

In an exemplary embodiment, the overdrive voltage is divided as a specific voltage that is greater than the nominal voltage. The third series of transistors are all biased by the specific voltage when the input signal is in the low-level state. The fourth series of transistors are all biased by the specific voltage when the input signal is in the high-level state.

In an exemplary embodiment, the first voltage-drop circuit comprises a first diode having a cathode coupled to the first series of transistors and an anode coupled to the third series of transistors, and the second voltage-drop circuit comprises a second diode having a cathode coupled to the second series of transistors and an anode coupled to the fourth series of transistors.

A chip with an overdrive capability in accordance with an exemplary embodiment of the present invention has the aforementioned level shifter, a control circuit, a pull-up circuit, and a pull-down circuit. The control circuit is powered by the nominal voltage. The pull-up circuit and the pull-down circuit are controlled according to the control circuit to couple a pad to the overdrive voltage or a ground. The level shifter is coupled between the control circuit and the pull-up circuit. Specifically, the level shifter receives the input signal from the control circuit and has the output terminal coupled to a control terminal of the pull-up circuit.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
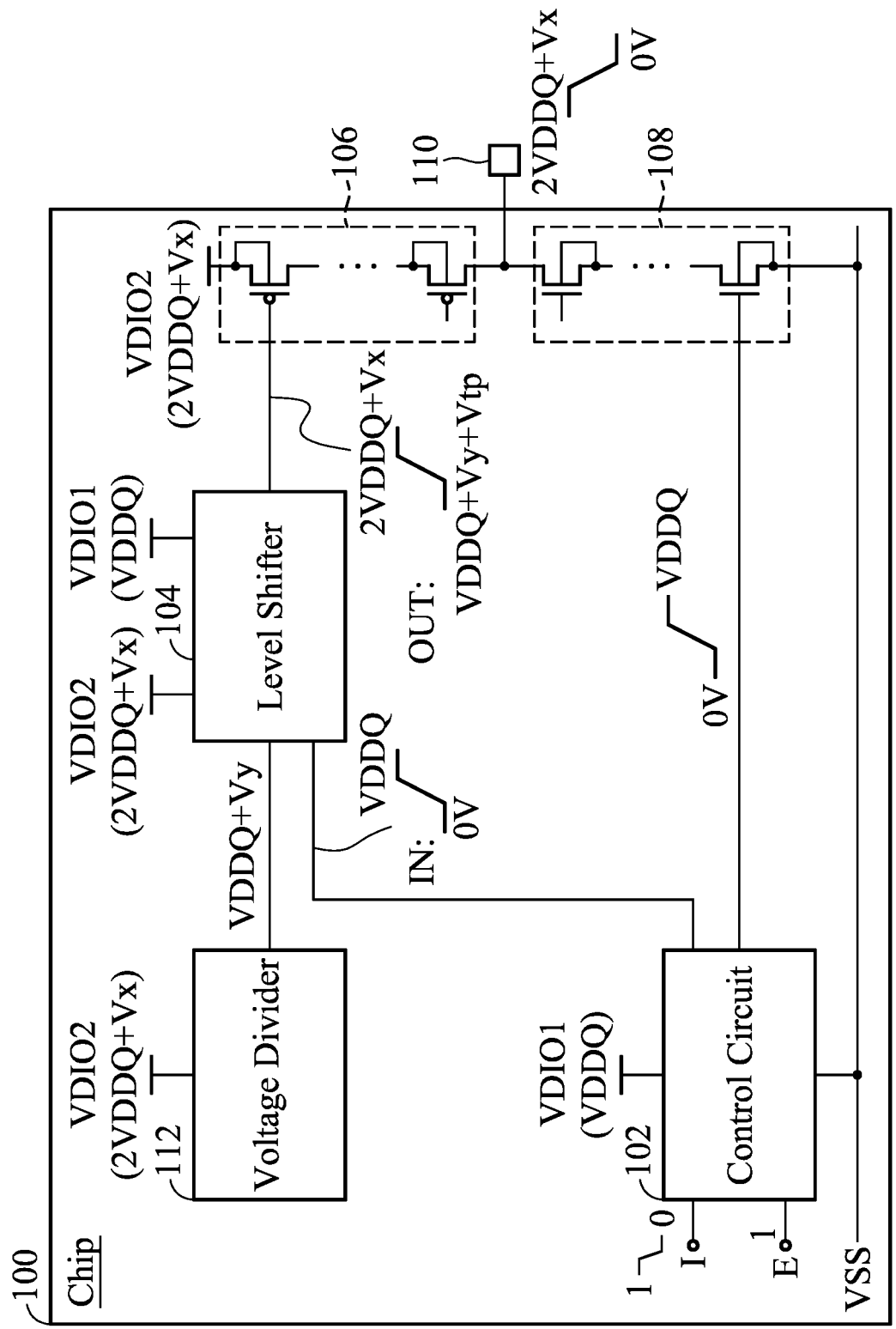
FIG. 1 shows a chip 100 with an overdrive capability in accordance with an exemplary embodiment of the present invention.

FIG. 1 shows a chip 100 with an overdrive capability in accordance with an exemplary embodiment of the present invention. FIG. 1 focuses on an output buffer of the chip 100. The output buffer includes a control circuit 102, a level shifter 104, a pull-up circuit 106, and a pull-down circuit 108. The output buffer presents the overdrive capability at a pad 110.

To achieve the overdrive capability, the chip 100 may have two power pins VDIO1 and VDIO2. The power pin VDIO1 receives a nominal voltage VDDQ. Each element within the chip 100 is safely operated within the nominal voltage VDDQ. The power pin VDIO2 receives an overdrive voltage 2VDDQ+Vx that is double the nominal voltage VDDQ plus a delta voltage Vx. For example, the nominal voltage VDDQ may be 1.5V, and the overdrive voltage may be 3.3V. In such an example, the delta voltage is 0.3V. The delta voltage 0.3V may affect the circuit reliability. Some special designs are proposed in the level shifter 104 to improve the circuit reliability.

The operations of the output buffer is described in this paragraph. As controlled by the control circuit 102, the pull-up circuit 106 or the pull-down circuit 108 may be turned on to pull up or down the voltage level of the pad 110. Rather than coupling the pad 110 to the nominal voltage VDDQ (VDIO1), the pull-up circuit 106 couples the pad 110 to the overdrive voltage 2VDDQ+Vx (VDIO2). The control circuit 102, however, is powered by the nominal voltage VDDQ (VDIO1). Thus, the level shifter 104 is required between the control circuit 102 and the pull-up circuit 106. As shown, the level shifter 104 receives an input signal IN (0V~VDDQ) from the control circuit 102, and has an output terminal OUT (outputting a boosted signal) coupled to a control terminal of the pull-up circuit 106. The level shifter 104 needs to output a proper signal to safely operate the connected PMOS of the pull-up circuit 106, and also needs to deal with the reliability problem (also due to the delta voltage Vx) within the level shifter 104. The level shifter 104 is discussed in the following paragraphs.

In this example, the level shifter 104 is coupled to both the first power pin VDIO1 (VDDQ) and the second power pin VDIO2 (2VDDQ+Vx), and further receives a specific voltage VDDQ+Vy for PMOS biasing. Considering the overdrive voltage 2VDDQ+Vx received from the second power pin VDIO2, the level shifter 104 includes protections circuits. There are voltage drop circuits (detailed in the later discussion) provided within the protections circuits to compensate for the delta voltage Vx. Furthermore, the specific voltage VDDQ+Vy applied to turning on the PMOSs within the protection circuits is greater than the nominal voltage VDDQ. These designs cure the reliability problem caused by the delta voltage. The level shifter 104 may boost its input signal IN to a range VDDQ+Vy+Vtp~2VDDQ+Vx (referring to OUT). The voltage Vtp is a threshold voltage of a PMOS. The voltage Vy may equal to the delta voltage Vx. The transistors within the level shifter 104 or controlled by the boosted signal from the level shifter 104 all are safely operated.

In FIG. 1, the chip 100 uses a voltage divider 112 to generate the specific voltage VDDQ+Vy by dividing the overdrive voltage 2VDDQ+Vx (received from VDIO2). In the other examples, the voltage divider is outside the chip 100.

In some exemplary embodiments, several specific voltages (e.g., VDDQ3+Vy, and VDDQ4+Vy in the following discussion) are generated, wherein VDDQ3 VDDQ4. The different stages of the cascaded PMOSs within the protection circuits of the level shifter may be coupled to the different bias sources (e.g., VDDQ3+Vy, or VDDQ4+Vy).

Figure 2:
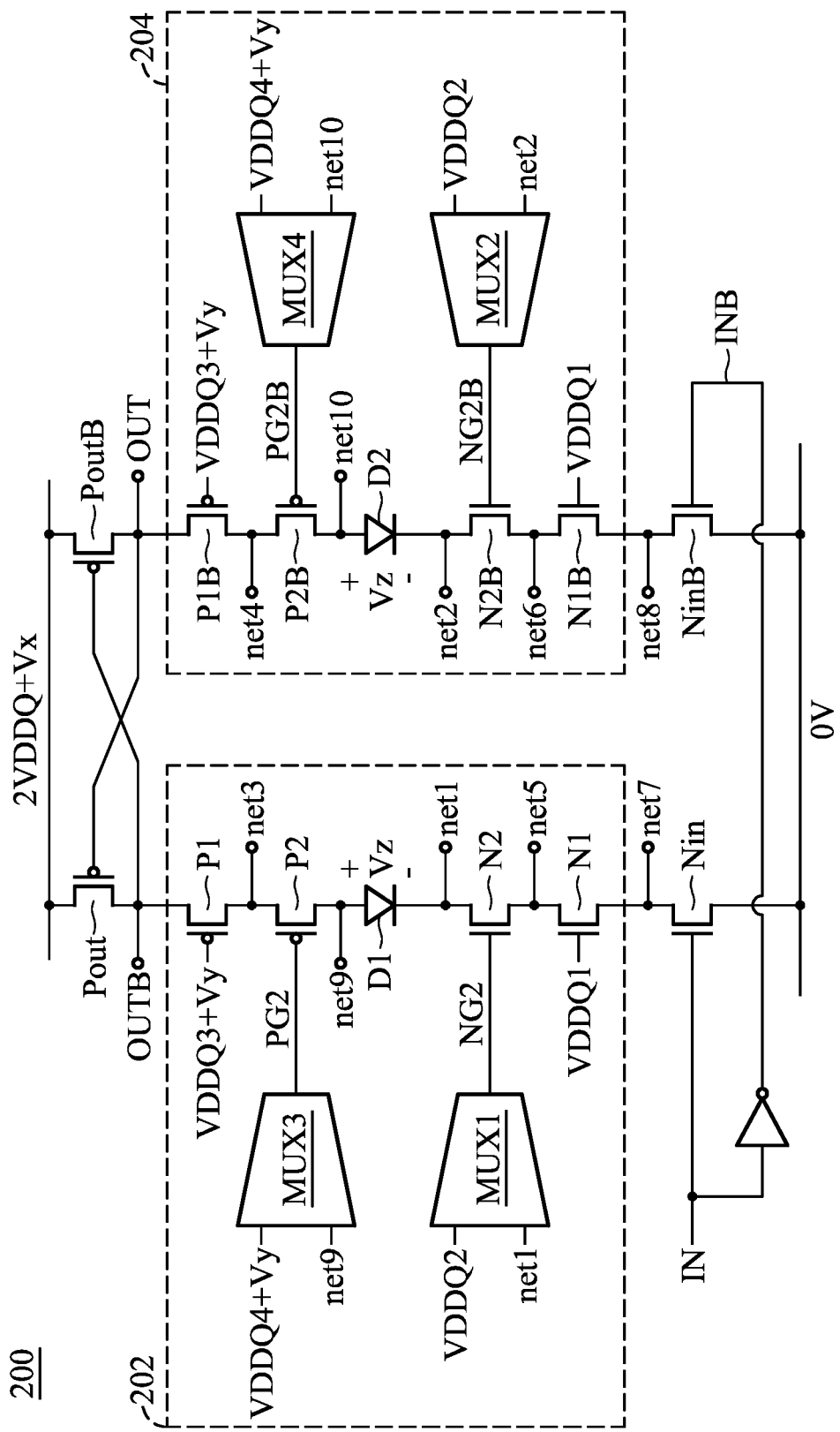
FIG. 2 depicts a level shifter 200 in accordance with an exemplary embodiment of the present invention.

FIG. 2 depicts a level shifter 200 in accordance with an exemplary embodiment of the present invention.

The level shifter 200 has an input pair (having a first input transistor Nin and a second input transistor NinB), a cross-coupled output pair (having a first output transistor Pout and a second output transistor PoutB), a first protection circuit 202, and a second protection circuit 204. The first input transistor Nin is controlled by an input signal IN of the level shifter 200. The second input transistor NinB is controlled by an inverse input signal INB of the level shifter 200. In response to a high-level state (VDDQ) of the input signal IN, the second output transistor PoutB pulls up an output terminal OUT of the level shifter 200 to an overdrive voltage 2VDDQ+Vx. In response to a low-level state (0V) of the input signal IN, the first output transistor Pout pulls up the inverting output terminal OUTB of the level shifter 200 to the overdrive voltage 2VDDQ+Vx. The first protection circuit 202 is coupled between the inverting output terminal OUTB and the first input transistor Nin. The second protection circuit 204 is coupled between the output terminal OUT and the second input transistor NinB. The first protection circuit 202 has a first voltage-drop circuit (including the first diode D1) that compensates for the delta voltage Vx (by the diode voltage Vz, which may equal to Vx). The second protection circuit 204 has a second voltage-drop circuit (including the second diode D2) that compensates for the delta voltage Vx (by the diode voltage Vz, which may equal to Vx).

In this example, there are four series of transistors provided by the first and second protection circuits 202 and 204. The first series of transistors (including NMOSs N1 and N2) and the second series of transistors (including NMOSs N1B and N2B) are provided within the first protection circuit 202 and the second protection circuit 204, respectively. The third series of transistors (including PMOSs P1 and P2) and the fourth series of transistors (including PMOSs P1B and P2B) are provided within the first protection circuit 202 and the second protection circuit 204, respectively. The third series of transistors (including PMOSs P1 and P2), the first voltage-drop circuit (including the first diode D1), and the first series of transistors (including NMOSs N1 and N2) are coupled between the inverting output terminal OUTB and the first input transistor Nin. The fourth series of transistors (including PMOSs P1B and P2B), the second voltage-drop circuit (including the second diode D2), and the second series of transistors (including NMOSs N1B and N2B) are coupled between the output terminal OUT and the second input transistor NinB.

The first diode D1 has a cathode coupled to the first series of transistors (including NMOSs N1 and N2), and an anode coupled to the third series of transistors (including PMOSs P1 and P2). The second diode D2 has a cathode coupled to the second series of transistors (including NMOSs N1B and N2B), and an anode coupled to the fourth series of transistors (including PMOSs P1B and P2B). The voltage drop provided by the diode voltage Vz eliminates the delta voltage Vx from the overdrive voltage 2VDDQ+Vx. Safe operations of the NMOSs within the first series of transistors (including NMOSs N1 and N2) and the second series of transistors (including NMOSs N1B and N2B) are achieved.

As for the third series of transistors (including PMOSs P1 and P2) and the fourth series of transistors (including PMOSs P1B and P2B), they are turned on by bias voltages around the specific voltage VDDQ+Vy. The voltage Vy eliminates the delta voltage Vx from the overdrive voltage 2VDDQ+Vx, and thereby the PMOSs within the third series of transistors (including PMOSs P1 and P2) and the fourth series of transistors (including PMOSs P1B and P2B) are safely operated.

The more circuit details of the level shifter 200 are further discussed in the following paragraphs.

The first input transistor Nin has a gate terminal controlled by the input signal IN, and a source terminal coupled to the ground 0V. The second input transistor NinB has a gate terminal controlled by the inverse input signal INB, and a source terminal coupled to the ground 0V. The first series of transistors comprises a first transistor N1 and a second transistor N2. The first transistor N1 has a source terminal coupled to a drain terminal of the first input transistor Nin, and a gate terminal biased by a first voltage VDDQ1. The second transistor N2 has a source terminal coupled to a drain terminal of the first transistor N1, and a drain terminal coupled to the first voltage-drop circuit D1. In response to the low-level state 0V of the input signal IN, a gate terminal of the second transistor N2 is biased by a voltage net1 of the drain terminal of the second transistor N2. The second series of transistors comprises a third transistor N1B and a fourth transistor N2B. The third transistor N1B has a source terminal coupled to a drain terminal of the second input transistor NinB, and a gate terminal biased by the first voltage VDDQ1. The fourth transistor N2B has a source terminal coupled to a drain terminal of the third transistor N1B, and a drain terminal coupled to the second voltage-drop circuit D2. In response to the high-level state VDDQ of the input signal IN, a gate terminal of the fourth transistor N2B is biased by a voltage net2 of the drain terminal of the fourth transistor N2B. The first voltage VDDQ1 may be around the nominal voltage VDDQ or equal to the nominal voltage VDDQ. The first voltage VDDQ1 may be generated by the voltage divider 112.

In FIG. 2, the gate terminal of the second transistor N2 is biased at a second voltage VDDQ2 in response to the high-level state VDDQ of the input signal IN, and the gate terminal of the fourth transistor N2B is biased at the second voltage VDDQ2 in response to the low-level state 0V of the input signal IN. The second voltage VDDQ2 may be around the nominal voltage VDDQ or equal to the nominal voltage VDDQ. The second voltage VDDQ2 may be generated by the voltage divider 112.

The first protection circuit 202 further has a first multiplexer Mux1, coupling the second voltage VDDQ2 to the gate terminal of the second transistor N2 in response to the high-level state VDDQ of the input signal IN, and coupling the drain terminal net1 of the second transistor N2 to the gate terminal of the second transistor N2 in response to the low-level state 0V of the input signal IN. The second protection circuit 204 further has a second multiplexer Mux2, coupling the second voltage VDDQ2 to the gate terminal of the fourth transistor N2B in response to the low-level state 0V of the input signal IN, and coupling the drain terminal net2 of the fourth transistor net2 to the gate terminal of the fourth transistor N2B in response to the high-level state VDDQ of the input signal IN.

In such a design, the NMOSs N1, N2, N1B, and N2B can be safely turned off (each having a drain-source voltage within the nominal voltage VDDQ). Circuit reliability is guaranteed.

The first output transistor Pout has a source terminal coupled to the overdrive voltage 2VDDQ+Vx, a gate terminal coupled to the output terminal OUT, and a drain terminal coupled to the inverting output terminal OUTB. The second output transistor PoutB has a source terminal coupled to the overdrive voltage 2VDDQ+Vx, a gate terminal coupled to the inverting output terminal OUTB, and a drain terminal coupled to the output terminal OUT. The third series of transistors comprises a fifth transistor P1 and a sixth transistor P2. The fifth transistor P1 has a source terminal coupled to the drain terminal of the first output transistor Pout, and a gate terminal biased by a third voltage VDDQ3+Vy. The sixth transistor P2 has a source terminal coupled to a drain terminal of the fifth transistor P1, and a drain terminal coupled to the first voltage-drop circuit D1. In response to the low-level state 0V of the input transistor Nin, a gate terminal of the sixth transistor P2 is biased by a fourth voltage VDDQ4+Vy. The second series of transistors comprises a seventh transistor P1B and an eighth transistor P2B. The seventh transistor P1B has a source terminal coupled to the drain terminal of the second output transistor PoutB, and a gate terminal biased by the third voltage VDDQ3+Vy. The eighth transistor P2B has a source terminal coupled to a drain terminal of the seventh transistor P1B, and a drain terminal coupled to the second voltage-drop circuit D2. In response to the high-level state VDDQ of the input signal IN, a gate terminal of the eighth transistor P2B is biased by the fourth voltage VDDQ4+Vy. The third voltage VDDQ3+Vy and the fourth voltage VDDQ4+Vy both are greater than the nominal voltage VDDQ, and may equal to VDDQ+Vy.

In FIG. 2, the gate terminal of the sixth transistor P2 is coupled to the drain terminal net9 of the sixth transistor P2 in response to the high-level state VDDQ of the input signal IN, and the gate terminal of the eighth transistor P2B is coupled to the drain terminal net10 of the eighth transistor P2B in response to the low-level state 0V of the input signal IN.

The first protection circuit 202 further has a third multiplexer Mux3, coupling the fourth voltage VDDQ4+Vy to the gate terminal of the sixth transistor P2 in response to the low-level state 0V of the input signal IN, and coupling the drain terminal net9 of the sixth transistor P2 to the gate terminal of the sixth transistor P2 in response to the high-level state VDDQ of the input signal IN. The second protection circuit 204 further has a fourth multiplexer Mux4, coupling the fourth voltage VDDQ4+Vy to the gate terminal of the eighth transistor P2B in response to the high-level state VDDQ of the input signal IN, and coupling the drain terminal net10 of the eighth transistor P2B to the gate terminal of the eighth transistor P2B in response to the low-level state 0V of the input signal IN.

In such a design, the PMOSs P1, P2, P1B and P2B can be safely turned on (each having a source-gate voltage within the nominal voltage VDDQ). Circuit reliability is guaranteed.

Figure 3A:
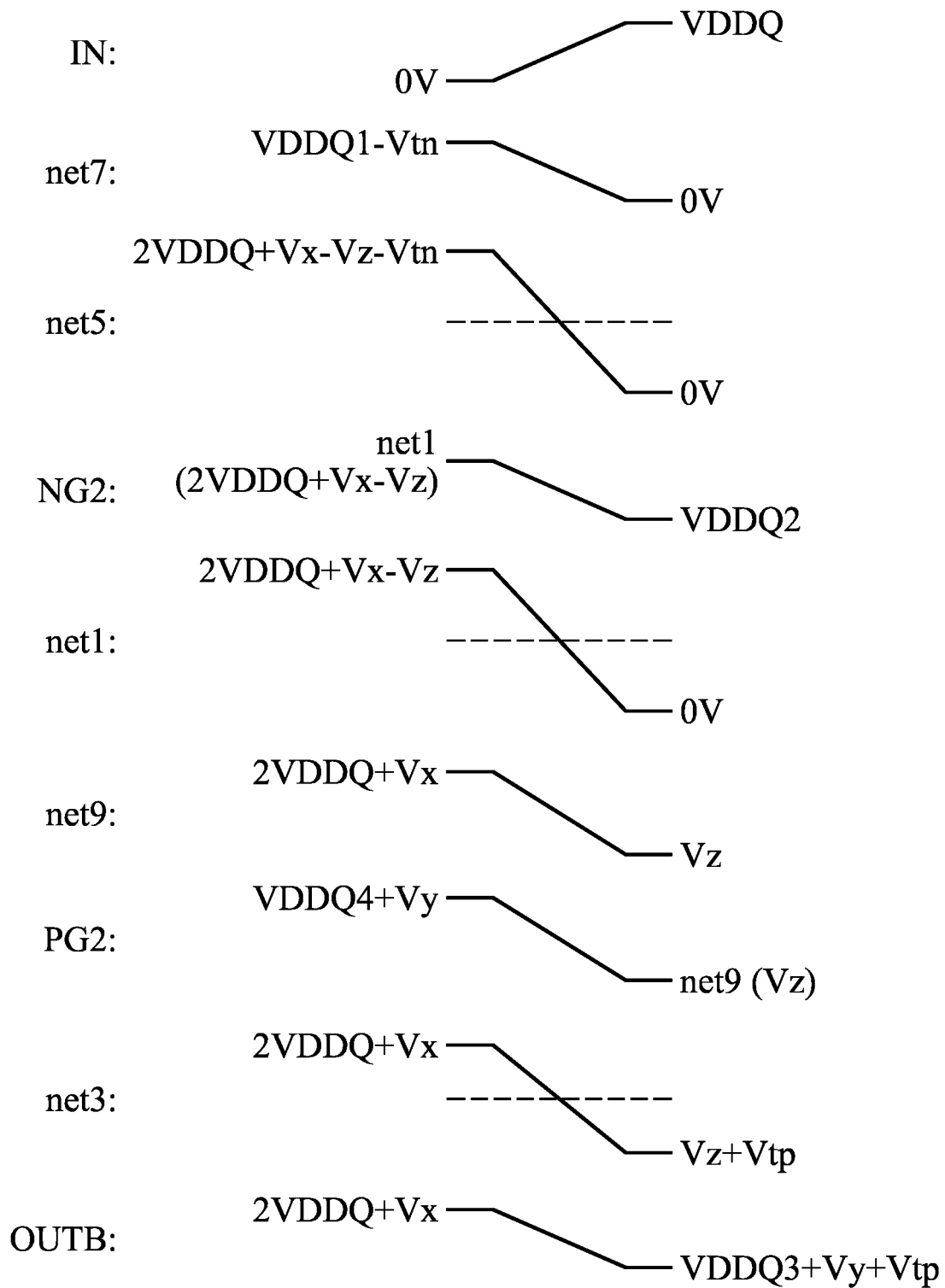
FIG. 3A shows the voltage transition of the terminals at the left side of the level shifter 200 shown in FIG. 2.

FIG. 3A shows the voltage transition of the terminals at the left side of the level shifter 200 shown in FIG. 2.

When the input signal IN is in its low state 0V, the transistors Nin, N1, and N2 are all off, and the transistors Pout, P1, and P2 are all on. As shown in the figure, the terminal net1 is at a voltage level (2VDDQ+Vx−Vz), the terminal net5 is at a voltage level (2VDDQ+Vx−Vz−Vtn), and the terminal net7 is at a voltage level (VDDQ1−Vtn), wherein Vtn is a threshold voltage of the transistor N2. The drain-source voltage of the transistor N2 is net1 minus net5 (=Vtn), within the nominal voltage VDDQ. The drain-source voltage of the transistor N1 is net5 minus net7 (=2VDDQ+Vx−Vz−VDDQ1≈VDDQ), within the nominal voltage VDDQ. The transistors N1 and N2 are safely operated. As for the turned-on transistors P1 and P2, their source-gate voltages are also successfully limited within the nominal voltage VDDQ for safe operations. As shown in the figure, the terminal OUTB is at a voltage level (2VDDQ+Vx), the terminal net3 is at a voltage level (2VDDQ+Vx), and the terminal PG2 is at a voltage level (VDDQ4+Vy). The source-gate voltage of the transistor P1 is OUTB minus (VDDQ3+Vy), which is 2VDDQ+Vx−VDDQ3−Vy (≈VDDQ), within the nominal voltage VDDQ for safe operations. The source-gate voltage of the transistor P2 is net3 minus PG2, which is 2VDDQ+Vx−VDDQ4−Vy (≈VDDQ), within the nominal voltage VDDQ for safe operations.

When the input signal IN is in its high state VDDQ, the transistors Nin, N1, and N2 are all on, and the transistors Pout, P1, and P2 are all off. As shown in the figure, the terminal net9 is at a voltage level Vz, the terminal net3 is at a voltage level (Vz+Vtp), and the terminal OUTB is at a voltage level (VDDQ3+Vy+Vtp), wherein Vtp is a threshold voltage of the transistor P2. The source-drain voltage of the transistor P2 is net3 minus net9 (=Vtp), within the nominal voltage VDDQ. The source-drain voltage of the transistor P1 is OUTB minus net3 (=VDDQ3+Vy+Vtp−Vz−Vtp≈VDDQ), within the nominal voltage VDDQ. The transistors P1 and P2 are safely operated.

Figure 3B:
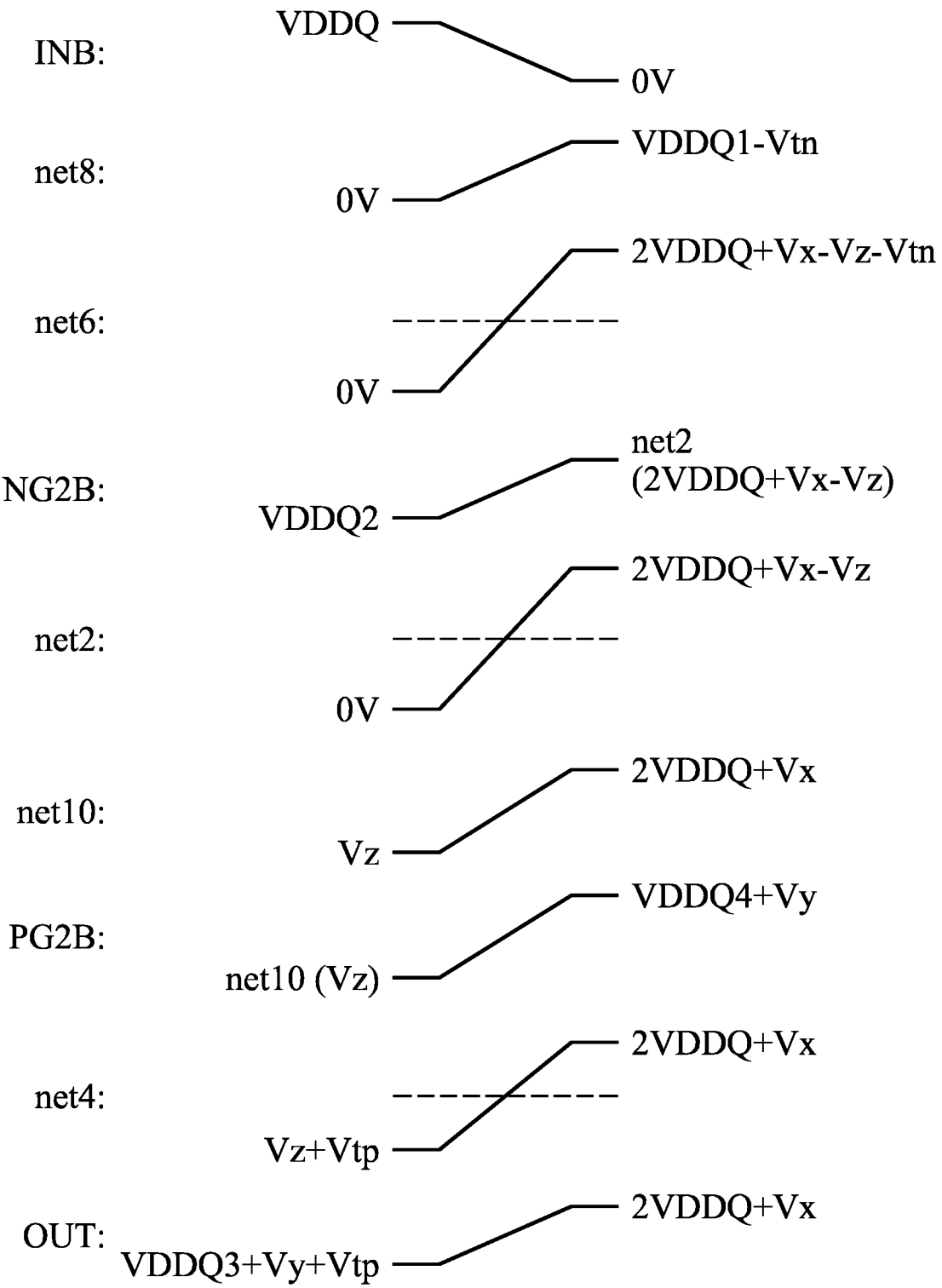
FIG. 3B shows the voltage transition of the terminals at the right side of the level shifter 200 shown in FIG. 2.

FIG. 3B shows the voltage transition of the terminals at the right side of the level shifter 200 shown in FIG. 2.

When the inverse input signal INB is in its high state VDDQ, the transistors NinB, N1B, and N2B are all on, and the transistors PoutB, P1B, and P2B are all off. As shown in the figure, the terminal net10 is at a voltage level Vz, the terminal net4 is at a voltage level (Vz+Vtp), and the terminal OUT is at a voltage level (VDDQ3+Vy+Vtp), wherein Vtp is a threshold voltage of the transistor P2B. The source-drain voltage of the transistor P2B is net4 minus net10 (=Vtp), within the nominal voltage VDDQ. The source-drain voltage of the transistor P1B is OUT minus net4 (=VDDQ3+Vy+Vtp−Vz−Vtp≈VDDQ), within the nominal voltage VDDQ. The transistors P1B and P2B are safely operated.

When the inverse input signal INB is in its low state 0V, the transistors NinB, N1B, and N2B are all off, and the transistors PoutB, P1B, and P2B are all on. As shown in the figure, the terminal net2 is at a voltage level (2VDDQ+Vx−Vz), the terminal net6 is at a voltage level (2VDDQ+Vx−Vz−Vtn), and the terminal net8 is at a voltage level (VDDQ1−Vtn), wherein Vtn is a threshold voltage of the transistor N2B. The drain-source voltage of the transistor N2B is net2 minus net6 (=Vtn), within the nominal voltage VDDQ. The drain-source voltage of the transistor N1B is net6 minus net8 (=2VDDQ+Vx−Vz−VDDQ1≈VDDQ), within the nominal voltage VDDQ. The transistors N1B and N2B are safely operated. As for the turned-on transistors P1B and P2B, their source-gate voltages are also successfully limited within the nominal voltage VDDQ for safe operations. As shown in the figure, the terminal OUT is at a voltage level (2VDDQ+Vx), the terminal net4 is at a voltage level (2VDDQ+Vx), and the terminal PG2B is at a voltage level (VDDQ4+Vy). The source-gate voltage of the transistor P1B is OUTB minus (VDDQ3+Vy), which is 2VDDQ+Vx−VDDQ3−Vy (≈VDDQ), within the nominal voltage VDDQ for safe operations. The source-gate voltage of the transistor P2B is net4 minus PG2B, which is 2VDDQ+Vx−VDDQ4−Vy (≈VDDQ), within the nominal voltage VDDQ for safe operations.

In the other exemplary embodiments, more transistors are cascaded within each series of transistors within the protection circuits 202 and 204.

In the other exemplary embodiments, the voltage-drop circuit is not limited to just one diode. Any circuit brings a stable voltage drop may be used to replace the diodes D1 and D2 shown in FIG. 2.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A level shifter, comprising:
an input pair, having a first input transistor and a second input transistor which are controlled by an input signal and an inverse input signal of the level shifter, respectively;
a cross-coupled output pair, having a first output transistor and a second output transistor, wherein the second output transistor pulls up an output terminal of the level shifter to an overdrive voltage in response to a high-level state of the input signal, and the first output transistor pulls up an inverting output terminal of the level shifter to the overdrive voltage in response to a low-level state of the input signal;
a first protection circuit, coupled between the inverting output terminal and the first input transistor; and
a second protection circuit, coupled between the output terminal and the second input transistor;
wherein:
the overdrive voltage is twice a nominal voltage of the level shifter plus a delta voltage;
the first protection circuit comprises a first voltage-drop circuit that compensates for the delta voltage, and a first series of transistors, wherein the inverting output terminal is coupled to the first input transistor through the first voltage-drop circuit and the first series of transistors;
the second protection circuit comprises a second voltage-drop circuit that compensates for the delta voltage, and a second series of transistors, wherein the output terminal is coupled to the second input transistor through the second voltage-drop circuit and the second series of transistors;
the first protection circuit further comprises a third series of transistors coupled between the inverting output terminal and the first voltage-drop circuit;
the second protection circuit further comprises a fourth series of transistors coupled between the output terminal and the second voltage-drop circuit;
the first output transistor has a source terminal coupled to the overdrive voltage, a gate terminal coupled to the output terminal, and a drain terminal coupled to the inverting output terminal;
the second output transistor has a source terminal coupled to the overdrive voltage, a gate terminal coupled to the inverting output terminal, and a drain terminal coupled to the output terminal;
the third series of transistors comprises a fifth transistor and a sixth transistor;
the fifth transistor has a source terminal coupled to the drain terminal of the first output transistor, and a gate terminal biased by a third voltage;
the sixth transistor has a source terminal coupled to a drain terminal of the fifth transistor, and a drain terminal coupled to the first voltage-drop circuit;
in response to the low-level state of the input signal, a gate terminal of the sixth transistor is biased by a fourth voltage;
the fourth series of transistors comprises a seventh transistor and an eighth transistor;
the seventh transistor has a source terminal coupled to the drain terminal of the second output transistor, and a gate terminal biased by the third voltage;
the eighth transistor has a source terminal coupled to a drain terminal of the seventh transistor, and a drain terminal coupled to the second voltage-drop circuit;

in response to the high-level state of the input signal, a gate terminal of the eighth transistor is biased by the fourth voltage; and the third voltage and the fourth voltage both are greater than the nominal voltage.

2. The level shifter as claimed in claim 1, wherein:

the first input transistor has a gate terminal controlled by the input signal, and a source terminal coupled to a ground;

the second input transistor has a gate terminal controlled by the inverse input signal, and a source terminal coupled to the ground;

the first series of transistors comprises a first transistor and a second transistor;

the first transistor has a source terminal coupled to a drain terminal of the first input transistor, and a gate terminal biased by a first voltage;

the second transistor has a source terminal coupled to a drain terminal of the first transistor, and a drain terminal coupled to the first voltage-drop circuit;

in response to the low-level state of the input signal, a gate terminal of the second transistor is biased by a voltage of the drain terminal of the second transistor;

the second series of transistors comprises a third transistor and a fourth transistor;

the third transistor has a source terminal coupled to a drain terminal of the second input transistor, and a gate terminal biased by the first voltage;

the fourth transistor has a source terminal coupled to a drain terminal of the third transistor, and a drain terminal coupled to the second voltage-drop circuit; and in response to the high-level state of the input signal, a gate terminal of the fourth transistor is biased by a voltage of the drain terminal of the fourth transistor.

3. The level shifter as claimed in claim 2, wherein:
the first voltage is the nominal voltage.

4. The level shifter as claimed in claim 2, wherein:

the gate terminal of the second transistor is biased at a second voltage in response to the high-level state of the input signal; and the gate terminal of the fourth transistor is biased at the second voltage in response to the low-level state of the input signal.

5. The level shifter as claimed in claim 4, wherein:
the first voltage is the nominal voltage; and
the second voltage is the nominal voltage.

6. The level shifter as claimed in claim 4, wherein:

the first protection circuit further has a first multiplexer, coupling the second voltage to the gate terminal of the second transistor in response to the high-level state of the input signal, and coupling the drain terminal of the second transistor to the gate terminal of the second transistor in response to the low-level state of the input signal; and the second protection circuit further has a second multiplexer, coupling the second voltage to the gate terminal of the fourth transistor in response to the low-level state of the input signal, and coupling the drain terminal of the fourth transistor to the gate terminal of the fourth transistor in response to the high-level state of the input signal.

7. The level shifter as claimed in claim 1, wherein:

the third voltage is the nominal voltage plus the delta voltage; and the fourth voltage is the nominal voltage plus the delta voltage.

8. The level shifter as claimed in claim 1, wherein:

the gate terminal of the sixth transistor is coupled to the drain terminal of the sixth transistor in response to the high-level state of the input signal; and the gate terminal of the eighth transistor is coupled to the drain terminal of the eighth transistor in response to the low-level state of the input signal.

9. The level shifter as claimed in claim 8, wherein:

the first protection circuit further has a third multiplexer, coupling the fourth voltage to the gate terminal of the sixth transistor in response to the low-level state of the input signal, and coupling the drain terminal of the sixth transistor to the gate terminal of the sixth transistor in response to the high-level state of the input signal; and the second protection circuit further has a fourth multiplexer, coupling the fourth voltage to the gate terminal of the eighth transistor in response to the high-level state of the input signal, and coupling the drain terminal of the eighth transistor to the gate terminal of the eighth transistor in response to the low-level state of the input signal.

10. The level shifter as claimed in claim 1, wherein:

the first voltage-drop circuit comprises a first diode having a cathode coupled to the first series of transistors, and an anode coupled to the third series of transistors; and the second voltage-drop circuit comprises a second diode having a cathode coupled to the second series of transistors, and an anode coupled to the fourth series of transistors.

11. A chip with an overdrive capability, comprising:
the level shifter as claimed in claim 1;
a control circuit, powered by the nominal voltage; and
a pull-up circuit and a pull-down circuit, controlled according to the control circuit to couple a pad to the overdrive voltage or a ground;

wherein the level shifter is coupled between the control circuit and the pull-up circuit, and the level shifter receives the input signal from the control circuit and has the output terminal coupled to a control terminal of the pull-up circuit.

12. The chip as claimed in claim 11, further comprising:

a voltage divider, dividing the overdrive voltage to provide a specific voltage that is greater than the nominal voltage;

the third series of transistors are all biased by the specific voltage when the input signal is in the low-level state; and the fourth series of transistors are all biased by the specific voltage when the input signal is in the high-level state.

13. A level shifter, comprising:

an input pair, having a first input transistor and a second input transistor which are controlled by an input signal and an inverse input signal of the level shifter, respectively;

a cross-coupled output pair, having a first output transistor and a second output transistor, wherein the second output transistor pulls up an output terminal of the level shifter to an overdrive voltage in response to a high-level state of the input signal, and the first output transistor pulls up an inverting output terminal of the level shifter to the overdrive voltage in response to a low-level state of the input signal;

a first protection circuit, coupled between the inverting output terminal and the first input transistor; and a second protection circuit, coupled between the output terminal and the second input transistor;

wherein:

the overdrive voltage is twice a nominal voltage of the level shifter plus a delta voltage;

the first protection circuit comprises a first voltage-drop circuit that compensates for the delta voltage, and a third series of transistors coupled between the inverting output terminal and the first voltage-drop circuit, wherein the third series of transistors each has a gate terminal biased by a specific voltage when the input signal is in the low-level state, and the specific voltage is divided from the overdrive voltage and greater than the nominal voltage, and, in response to the high-level state of the input signal, a lower transistor in the third series of transistors has connected gate and drain terminals; and the second protection circuit comprises a second voltage-drop circuit that compensates for the delta voltage, and a fourth series of transistors coupled between the output terminal and the second voltage-drop circuit, wherein the fourth series of transistors each has a gate terminal biased by the specific voltage when the input signal is in the high-level state, and, in response to the low-level state of the input signal, a lower transistor in the fourth series of transistors has connected gate and drain terminals.

14. The level shifter as claimed in claim 13, wherein:

the first protection circuit further comprises a first series of transistors;

the inverting output terminal is coupled to the first input transistor through the third series of transistors, the first voltage-drop circuit, and the first series of transistors;

the second protection circuit further comprises a second series of transistors;

the output terminal is coupled to the second input transistor through the fourth series of transistors, the second voltage-drop circuit, and the second series of transistors;

the first series of transistors each has a gate terminal biased by the nominal voltage when the input signal is in the high-level state, and, in response to the low-level state of the input signal, a higher transistor in the first series of transistors has connected gate and drain terminals; and the second series of transistors each has a gate terminal biased by the nominal voltage when the input signal is in the low-level state, and, in response to the high-level state of the input signal, a higher transistor in the second series of transistors has connected gate and drain terminals.

15. A chip with an overdrive capability, comprising:

the level shifter as claimed in claim 13;

a control circuit, powered by the nominal voltage; and a pull-up circuit and a pull-down circuit, controlled according to the control circuit to couple a pad of the chip to the overdrive voltage or a ground;

wherein the level shifter is coupled between the control circuit and the pull-up circuit, and the level shifter receives the input signal from the control circuit and has the output terminal coupled to a control terminal of the pull-up circuit.

* * * * *